United States Patent
Fakiri et al.

(10) Patent No.: US 12,172,423 B2
(45) Date of Patent: Dec. 24, 2024

(54) COMPOSITE SANDWICH PANEL WITH TAILORED THERMAL EXPANSION COEFFICIENT

(71) Applicant: SAUDI ARABIAN OIL COMPANY, Dhahran (SA)

(72) Inventors: Abderrahim Fakiri, Dhahran (SA); Waleed Al Nasser, Ad Dammam (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 37 days.

(21) Appl. No.: 18/052,812

(22) Filed: Nov. 4, 2022

(65) Prior Publication Data

US 2024/0149553 A1    May 9, 2024

(51) Int. Cl.
*B32B 5/26*        (2006.01)
*B32B 5/12*        (2006.01)
*B32B 5/18*        (2006.01)

(52) U.S. Cl.
CPC .............. *B32B 5/26* (2013.01); *B32B 5/12* (2013.01); *B32B 5/18* (2013.01);
(Continued)

(58) Field of Classification Search
CPC .... B32B 5/26; B32B 5/12; B32B 5/18; B32B 2262/101; B32B 2262/106;
(Continued)

(56) References Cited

U.S. PATENT DOCUMENTS 4,394,529 A     7/1983  Gounder
6,318,673 B1 *  11/2001 Wolters .................... B64G 1/58
                                                244/171.7
(Continued)

FOREIGN PATENT DOCUMENTS

EP    3470218 B1   11/2020
FR    2769166 A1    4/1999
(Continued)

OTHER PUBLICATIONS

[NPL-1] Ishii (JP 3902429 B2); Apr. 4, 2007 (Google Patents—Machine translation to English). (Year: 2007).*
(Continued)

*Primary Examiner* — David Sample
*Assistant Examiner* — Donald M Flores, Jr.
(74) *Attorney, Agent, or Firm* — Osha Bergman Watanabe & Burton LLP

(57) ABSTRACT

A photovoltaic module includes a plurality of ribbons; and a composite panel comprising a core layer and a skin layer supported by a surface of the core layer, where the core layer includes a core material and the skin layer is formed of a matrix material and a plurality of parallel fibers aligned with the ribbons and disposed in the matrix material. A method of making a photovoltaic module includes applying a pair of skin layers to a core layer, each skin layer including a skin material and a plurality of parallel fibers disposed in the skin material to make a composite sandwich panel; and layering a component including ribbons between the composite sandwich panel and a thin, transparent front sheet; wherein the parallel fibers are aligned with the ribbons; where the composite sandwich panel has a coefficient of thermal expansion matching the coefficient of thermal expansion of the component.

17 Claims, 6 Drawing Sheets

(52) U.S. Cl.
CPC ... *B32B 2262/101* (2013.01); *B32B 2262/106* (2013.01); *B32B 2305/022* (2013.01); *B32B 2305/10* (2013.01); *B32B 2375/00* (2013.01); *B32B 2457/12* (2013.01)

(58) Field of Classification Search
CPC .......... B32B 2305/022; B32B 2305/10; B32B 2375/00; B32B 2457/12
See application file for complete search history.

(56) References Cited

U.S. PATENT DOCUMENTS

| | | | | |
|---|---|---|---|---|
| 8,016,007 | B2 * | 9/2011 | Ashjaee | H01L 31/188 156/499 |
| 2008/0286522 | A1 * | 11/2008 | Khan | D21H 13/00 428/116 |
| 2011/0226312 | A1 | 9/2011 | Boehm | |
| 2019/0131464 | A1 * | 5/2019 | Seki | H02S 40/36 |
| 2020/0055276 | A1 * | 2/2020 | Katsuya | B32B 27/20 |
| 2020/0180266 | A1 | 6/2020 | Lacounte | |
| 2022/0328710 | A1 | 10/2022 | Van Den Heuvel | |

FOREIGN PATENT DOCUMENTS

| | | | | |
|---|---|---|---|---|
| JP | H04270642 | A | 9/1992 | |
| JP | 2005167233 | A | 6/2005 | |
| JP | 3902429 | B2 * | 4/2007 | |
| JP | 2008068437 | A | 3/2008 | |
| WO | 2008076405 | A1 | 6/2008 | |
| WO | WO-2018013618 | A1 * | 1/2018 | ......... H01L 31/0392 |
| WO | 2022112423 | A1 | 6/2022 | |

OTHER PUBLICATIONS

[NPL-2] "E-Glass Fibers"; MatWeb, Jun. 5, 2024, <https://www.matweb.com/search/datasheet.aspx?matguid=d9c18047c49147a2a7c0b0bb1743e812>. (Year: 2024).*
[NPL-3] "Polyethylene"; Wikipedia, Jun. 5, 2024, <https://en.wikipedia.org/wiki/Polyethylene>. (Year: 2024).*
[NPL-4] "Divinycell@HP Technical Data"; Diab Group, Apr. 2022, <https://www.diabgroup.com/media/enygao3k/diab-divinycell-hp-april-2022-rev26-si.pdf>. (Year: 2022).*
International Search Report issued in corresponding International Application No. PCT/US2023/078654; mailed Feb. 22, 2024 (6 pages).
Written Opinion of the International Searching Authority issued in corresponding International Application No. PCT/US2023/078654; dated Feb. 22, 2024 (9 pages).

* cited by examiner

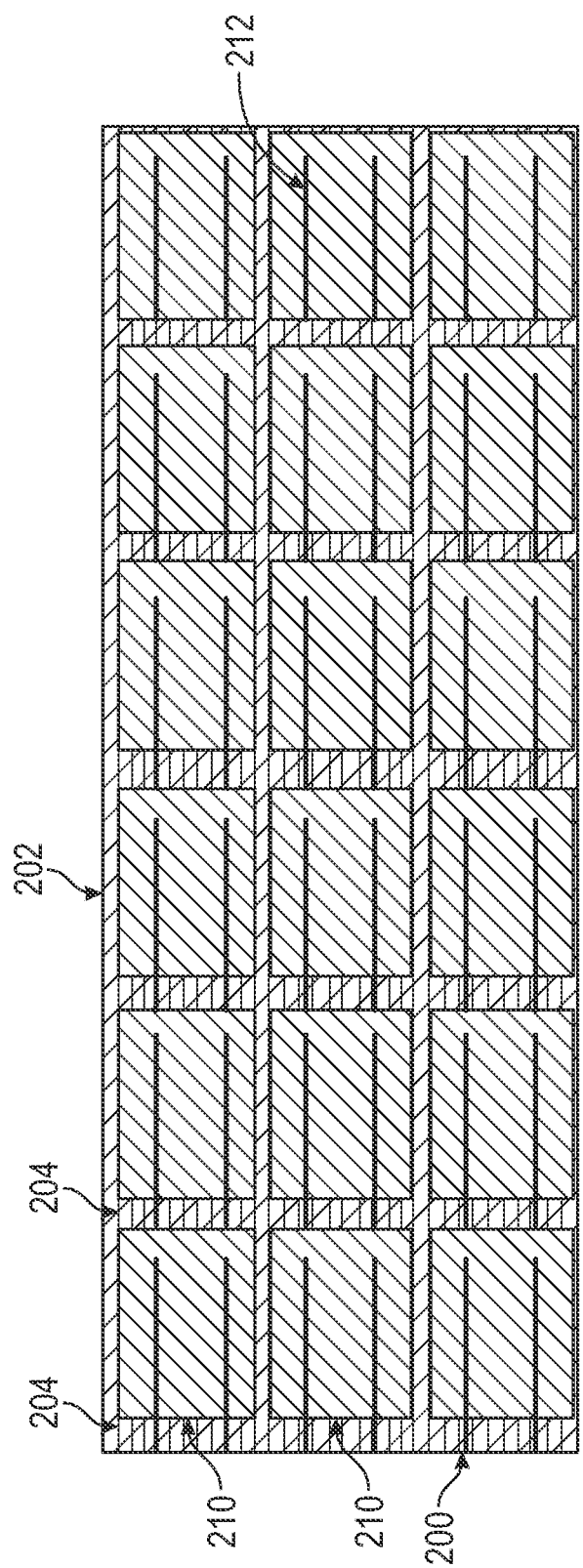
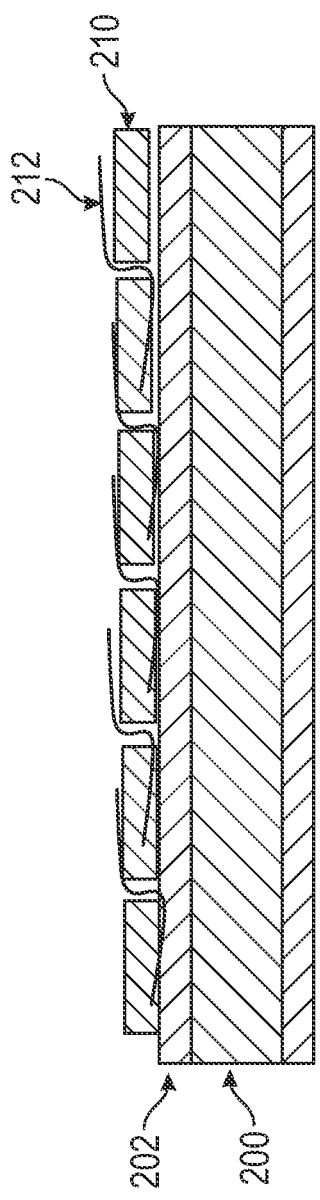
FIG. 2A
FIG. 2B

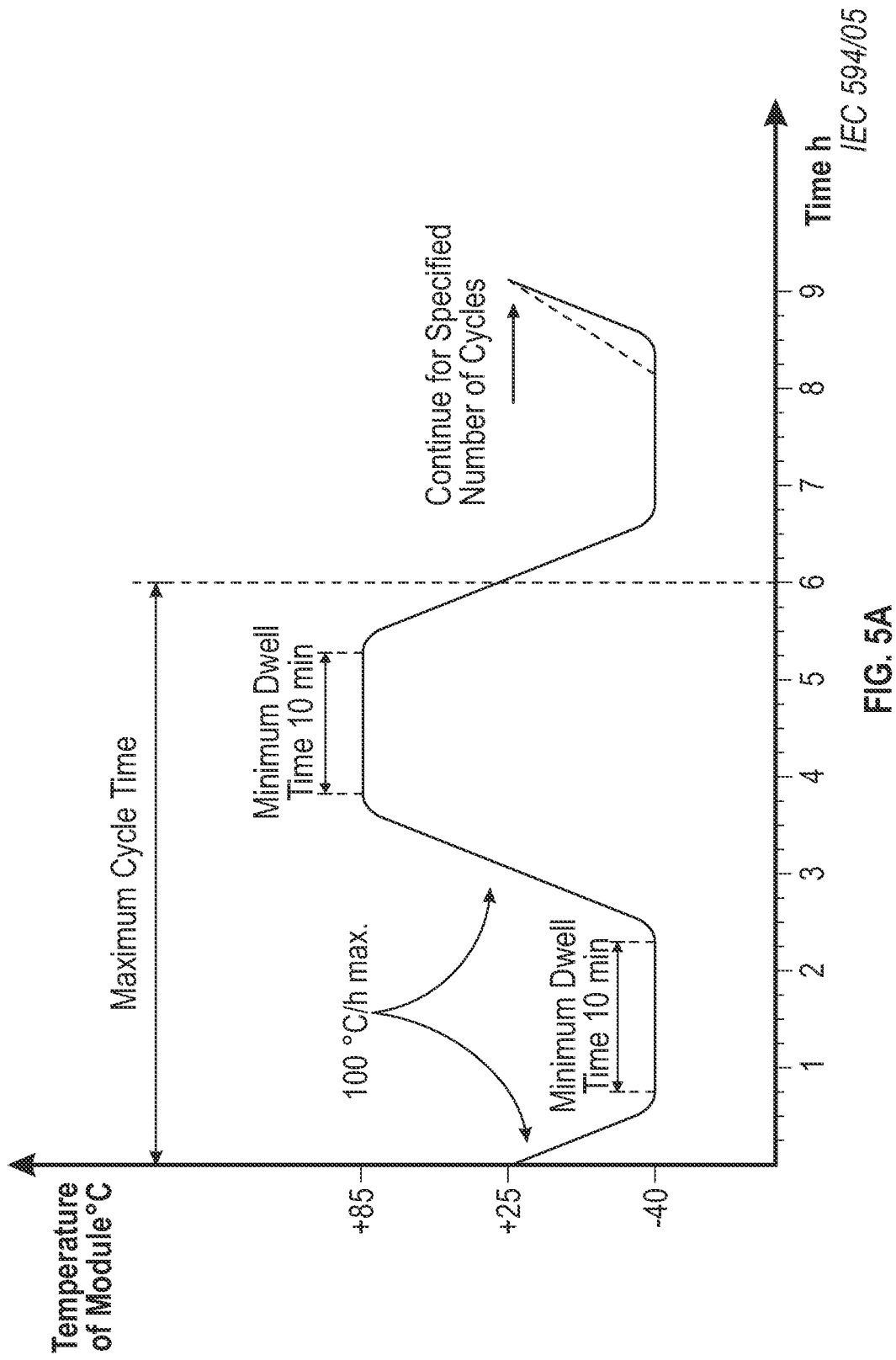

COMPOSITE SANDWICH PANEL WITH TAILORED THERMAL EXPANSION COEFFICIENT

FIELD OF THE DISCLOSURE

Embodiments of the present disclosure generally relate to a composite sandwich panel for photovoltaic applications.

BACKGROUND

Sandwich panels are used in various industries such as building and construction electronics, photovoltaic, aerospace, and automotive. Sandwich panels can have attributes and advantages that influence their use in selected applications. For example, sandwich panels can have a stiffness-to-weight ratio and a strength-to-weight ratio that makes them suitable in applications where weight and structural integrity are factors. When a sandwich panel is used in conjunction with other components, the coefficient of thermal expansion (CTE) can play a role in the interaction of the sandwich panel with the other components. However, it can be difficult to control the coefficient of thermal expansion sufficiently to avoid failure related to mismatch with the coefficients of thermal expansion of the other components.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to a photovoltaic module including a plurality of ribbons and a composite panel for a photovoltaic module that includes a core layer and a skin layer supported by a surface of the core layer, where the core layer includes a core material and the skin layer is formed of a matrix material and a plurality of parallel fibers aligned with the ribbons and disposed in the matrix material.

In another aspect, embodiments disclosed herein relate to a method of making a photovoltaic module that includes applying a pair of skin layers to a core layer, each skin layer including a skin material and a plurality of parallel fibers disposed in the skin material to make a composite sandwich panel; and layering a component including ribbons between the composite sandwich panel and a thin, transparent front sheet; where the parallel fibers are aligned with the ribbons; and where the composite sandwich panel has a coefficient of thermal expansion matching the coefficient of thermal expansion of the component.

Other aspects and advantages of the claimed subject matter will be apparent from the following description and the appended claims.

BRIEF DESCRIPTION OF DRAWINGS

FIG. 2A is a schematic showing a top view of a photovoltaic module with a composite panel as a back panel, including fibers oriented in common with ribbons in accordance with one or more embodiments.

FIG. 2B is a schematic showing a side view of a photovoltaic module with a composite panel as a back panel, including fibers oriented in common with ribbons in accordance with one or more embodiments.

FIG. 5A is a schematic of an exemplary thermocycling test profile over a temperature range from −40° C. to 85° C. of repeated cycling as occurring in prophetic fatigue testing in accordance with one or more embodiments.

DETAILED DESCRIPTION

In one aspect, embodiments disclosed herein relate to photovoltaic panel including a plurality of ribbons and a composite panel that includes a core layer including a core material and a skin layer supported by a surface of the core layer and formed of matrix material and a plurality of parallel fibers aligned with the ribbons and disposed in the matrix material.

Figure 1A:
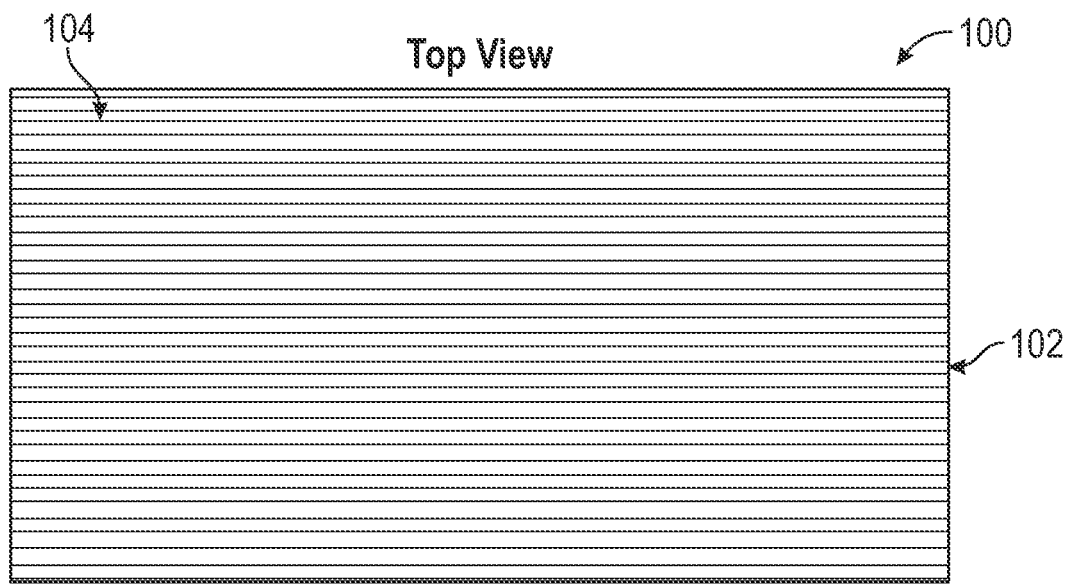
FIG. 1A is an illustration showing a top view of the composite article without any component in accordance with one or more embodiments.
Figure 1B:
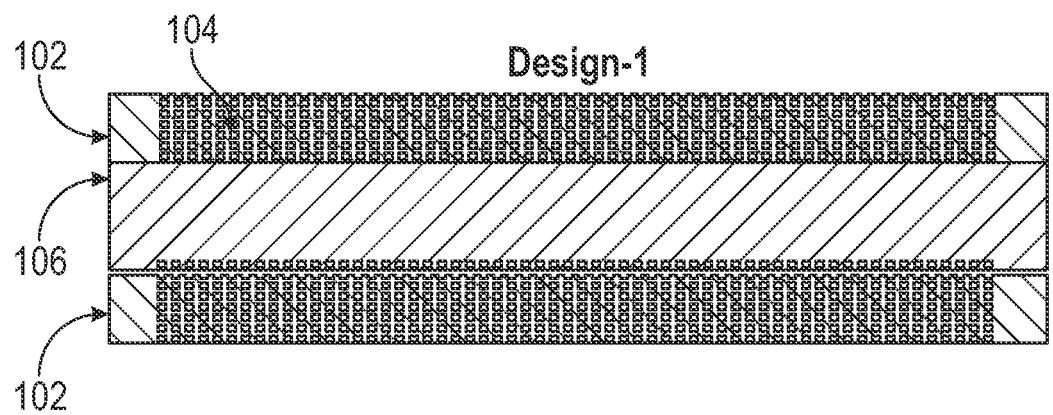
FIG. 1B is an illustration showing a first design or configuration of a composite article without any component in accordance with one or more embodiments.
Figure 1C:
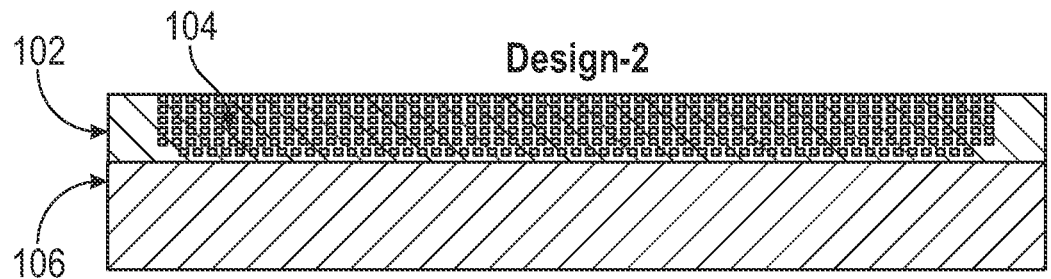
FIG. 1C is an illustration showing a second design or configuration of a composite article without any component in accordance with one or more embodiments.
Figure 1D:
FIG. 1D is an illustration showing a third design or configuration of a composite article without any component in accordance with one or more embodiments.

As shown in the FIG. 1A, in one or more embodiments a top view 100 of a composite panel illustrates a skin layer 102 having parallel fibers 104. The parallel fibers 104 are aligned in a unidirectional way. As used herein, "unidirectional" refers to all individual fibers running parallel in common to a single direction. That is, the parallel fibers 104 are all parallel to each other. As shown in the FIGS. 1B, 1C, and 1D different constructions of the composite panel structure may be used according to one or more embodiments. Irrespective of the construction of the composite panel, the skin layer 102 constituting the parallel fibers 104 may be configured in a unidirectional pattern. Thus, the skin layer 102 may include a plurality of parallel fibers 104. The parallel fibers 104 may have a unidirectional orientation along the longitudinal direction of the core layer 106. As shown in the FIG. 1C, a skin layer 102 may be supported by a surface of core layer 106. As shown in FIG. 1B, another skin layer 102 may be supported by an opposing surface of core layer 106. As shown in the FIG. 1D, the composite panel may include a through the thickness of the skin layer. That is, the core layer may have the same composition as the skin layer.

As shown in FIGS. 1A, 1B, 1C, and 1D, skin layer 102 may be formed of a matrix material and a plurality of parallel fibers disposed in the matrix material. The parallel fibers may be embedded in the matrix material. As used herein, the term "embedded" refers to fixed, where fixed refers to disposed so as to be immovable. That is, the parallel fibers embedded in the matrix material are disposed in the matrix material so as to be immovable. The skin layer may be made from unidirectional tape. The core layer may be made of a material from the group consisting of rigid foam, honeycomb, polyurethane, solid plastics, and combinations thereof. The core layer may be made of the same material or materials as the skin layer. That is the core layer may be made of a material that is the same as the matrix material. The core layer may further include another plurality of parallel fibers that may be oriented in the common direction.

In one or more embodiments, the core layer of the composite sandwich panel may include a rigid material such as a rigid foam, for example polystyrene rigid foam, polyurethane rigid foam, or combinations thereof. In one or more embodiments, the core layer of the composite sandwich panel may include a solid plastic such as high density polyethylene (HDPE), ultra high molecular weight polyethylene (UHMWPE), polytetrafluoroethylene (PTFE), or combinations thereof. In one or more embodiments, the core layer of the composite sandwich panel may include polyurethane rigid foam. In other embodiments, the core layer of the composite sandwich panel may include a honeycomb made from aluminum honeycomb, meta-aramid poly(meta-phenyleneisophthalamide) honeycomb, thermoplastic honeycomb, or combinations thereof. Meta-aramid poly(meta-phenyleneisophthalamide) honeycomb is available from Dupont under the tradename Nomex®.

In one or more embodiments, the core layer of the composite sandwich panel may have a coefficient of thermal expansion ranging from about 4 to about 100 ($10^{-6}$/° C.) In one or more embodiments, the core layer of the composite sandwich panel may include several layers of thin layers comprising rigid materials.

In one or more embodiments, the core layer of the composite sandwich panel may have a thickness of from about 5 mm to about 100 mm. It will be understood that the suitable shape, width, and length of the composite sandwich panel are not limited herein and may be selected suitable to the application.

In one or more embodiments, the core layer of the composite sandwich panel may be covered from one side to another side along with the longitudinal direction by the skin layer. In one or more embodiments, the core layer of the composite sandwich panel may be covered from one side to another side along with the traverse direction by the skin layer.

In one or more embodiments, the skin layer of the composite sandwich panel may be made of unidirectional tape. The unidirectional tape may comprise a set of fibers having the same orientation as the direction of the unidirectional tape. In one or more embodiments, the unidirectional tape may be consolidated. As used herein, the term "consolidated" refers to being joined together into a coherent, compact, or unified whole tape.

In one or more embodiments, the fiber material for making the unidirectional tape can be selected from the group consisting of: glass fibers, carbon fibers, basalt fibers, aramid fibers, boron fibers, and combinations thereof. In one or more embodiments, the skin layer of the composite sandwich panel may be constructed by a combination of one, two, three or more fiber materials to tailor the stiffness and coefficient of thermal expansion requirements suitable to the application. For a non-limiting example, the fiber material for making the unidirectional tape can be a composite of glass and carbon fibers, glass and aramid fibers, glass and basalt fibers, glass and boron fibers, or carbon and glass and boron fibers.

In one or more embodiments, the skin layer of the composite sandwich panel may have a thickness of from about 0.2 mm to about 25 mm. It will be understood that the width, and length of the skin layer of the composite sandwich panel are not limited herein and may be selected suitable to the application.

In one or more embodiments, the skin layer of the composite sandwich panel may be attached to the core layer by means of a conventional structure adhesive suitable for photovoltaic applications. Suitable adhesives include ethylene vinyl acetate (EVA), ionomers, polyurethane, silicone, and the like.

In one or more embodiments, the skin layer of the composite sandwich panel may be attached to one side of a rectangular-shaped core layer. In one or more embodiments, the skin layer of the composite sandwich panel may be attached to two sides of a rectangular-shaped core layer.

In one or more embodiments, the volume of the skin layer of the composite sandwich panel may be from about 5% to about 100% of the total volume of the composite sandwich panel. In one or more embodiments, the volume ratio between the volume of the skin layer to the volume of the core layer of the composite sandwich panel may range from about 0.05 to about 1.

The composite panel may have a tailorable coefficient of thermal expansion. The thermal expansion of the composite sandwich panel may be dependent on the type of fibers disposed in the skin layer. In one or more embodiments, the thermal expansion of the composite sandwich panel is dependent on the thickness of each skin layer. In one or more embodiments, the thermal expansion of the composite sandwich panel is dependent on the volume fraction of the one or more skin layers in the sandwich panel. In one or more embodiments, the thermal expansion of the composite sandwich panel is dependent on the thermal expansion of the core layer.

The coefficient of thermal expansion of the composite panel may match the coefficient of thermal expansion of a component layered with the composite panel. The coefficient of thermal expansion of the composite panel may be in the same range as the coefficient of thermal expansion of the component. The coefficient of thermal expansion of the composite panel may have the same value as the coefficient of thermal expansion of the component. The composite panel may be used in a photovoltaic module containing the component. The photovoltaic module may include the component layered between the composite panel, serving as a back panel, and a thin transparent front sheet. The photovoltaic module may be lightweight.

As shown in FIGS. 2A and 2B, in one or more embodiments, a composite panel 200 is layered with solar cells 210 and ribbons 212. Composite panel 200, solar cells 210, and ribbons 212 may be part of a photovoltaic module. Ribbons 212 are aligned with a longitudinal direction of the photovoltaic modules. That is, each ribbon 212 has a length running perpendicular to the cross-section of ribbon 212 and in parallel with the longitudinal direction. The longitudinal direction is a nominal line along the length of the photovoltaic module. Solar cells 210 are oriented in alignment with the longitudinal direction. That is, each solar cell 210 has a length running perpendicular to the cross-section of solar cell 210 and in parallel with the longitudinal direction. Composite panel 200 includes skin layer 202 having parallel fibers 204. Parallel fibers 204 are oriented in the same longitudinal direction as ribbons 212. That is, the longitudinal direction is the single direction, individual fibers running parallel in common to a single direction. Parallel fibers 204 are also oriented in the same longitudinal direction of solar cells 210. Ribbons 212 may be copper ribbons. Ribbons 212 may be interconnection ribbons. Composite panel 200 may serve as a back panel for the photovoltaic module. It will be understood that a composite panel may be layered with alternative components. For example, a layered component can include a wire, circuit, solar cell, and, or ribbon, or combinations thereof. Composite panel 200 may avoid premature fatigue failure of ribbons, the solder material, and cells during thermal cycling testing.

Figure 3:
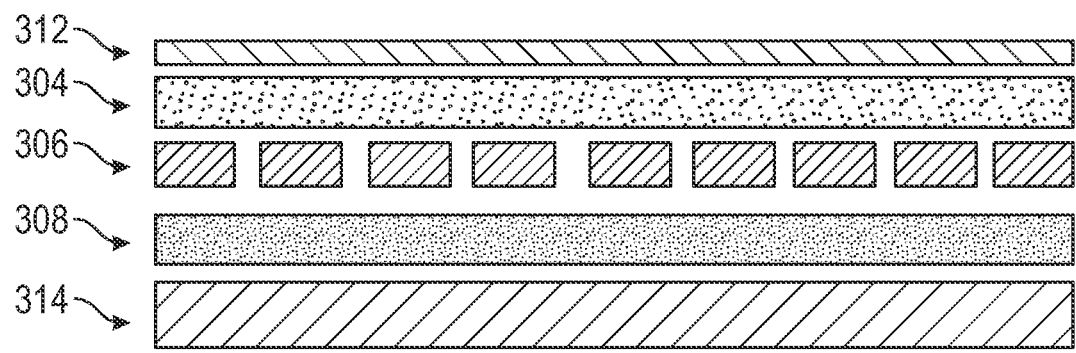
FIG. 3 is a schematic showing a photovoltaic module structure in accordance with one or more embodiments.

As shown in FIG. 3, an exemplary photovoltaic module structure in accordance with the embodiments may include a front sheet 312 on top, a first EVA 304 below the front sheet 312, a Si Cell 306 below the first EVA 304, a second EVA 308, and a back panel 314 below the second EVA 308. A composite panel as described herein may serve as back panel 314. Front sheet 312 may be a thin film. The thin film may be a highly transparent film layer. The back panel 314 may be rigid. The back panel may need to have a thickness of from about 1 mm to about 100 mm in order to provide the required stiffness and prevent excessive bowing to the module. The photovoltaic module has a controllable coefficient of thermal expansion based on the design of the back panel. may be lightweight. The structure may be more advantageous for being lighter weight, and the back panel may be used to provide structural and mechanical support to the photovoltaic module. The present composite panel may occupy the largest volume fraction of the photovoltaic module. The present composite panel may dominate the thermal expansion of the overall photovoltaic module.

Still referring to FIG. 3, in one or more embodiments, the front sheet 312 is made of a thin film that includes a highly transparent material. In one or more embodiments, the highly transparent material includes a thermoset polymer. In one or more embodiments, the highly transparent material includes a thermoplastic polymer. Non-limiting examples of suitable highly transparent material include poly(methyl methacrylate) (PMMA), ethylene tetrafluoroethylene (ETFE), ethylene chlorotrifluoroethylene E-CTFE, cyclic olefin copolymer (COC), epoxy, polycarbonate, and combinations thereof. Front sheet 312 may include materials that have the high abrasion resistance and are transparent over module lifespan. The thin film may be corona treated or coated from the inner side to ensure good and durable bonding with EVA encapsulant. In one or more embodiments, the thin film may have good electrical isolation properties. Front sheet 312 may have a thickness of from about 250 micrometers to about 5000 micrometers and may not significantly contribute to the thermal expansion of the module compared to the back sheet.

In other aspects, embodiments disclosed herein relate to a method of making a photovoltaic module. The method includes applying a pair of skin layers to a core layer, each skin layer comprising a skin material and a plurality of parallel fibers disposed in the skin material to make a composite sandwich panel; layering a component including ribbons between the composite sandwich panel and a thin, transparent front sheet, wherein the parallel fibers are aligned with the ribbons; wherein the composite panel has a coefficient of thermal expansion matching the coefficient of thermal expansion of the component.

EXAMPLES

Examples 1 to 3

Three different composite sandwich panel structure samples in accordance with one or more embodiments were prepared and tested. The test data were generated using Microsoft Excel's "what if analysis" tool. Three scenarios were run as shown in the examples below. The three samples described further in the examples below have the composition shown as below:

|  | Skin Layer | Core Layer |
| --- | --- | --- |
| Example 1 | carbon fiber/epoxy | polyurethane rigid foam |
| Example 2 | glass fiber/epoxy | polyurethane rigid foam |
| Example 3 | Kevlar/epoxy | polyurethane rigid foam |

The test result or output is the coefficient of thermal expansion in the longitudinal direction of the overall composite sandwich panel structure for the back panel. The coefficient of thermal expansion was calculated using the in-plane, coefficient of thermal expansion formula, equation 1 as shown below:

$$\alpha_1 = \frac{E_{f1}\alpha_{f1}V_f + E_m\alpha_m V_m}{E_{f1}V_f + E_m V_m} \quad (1)$$

The same formula (1) was used to calculate the coefficient of thermal expansion of a unidirectional tape in the direction of the fibers in the skin layer.

For calculating the coefficient of thermal expansion, the main two variables are as follows: (1) the volume fraction of the skin layer in the sandwich panel (i.e. percentage thickness of skin layer of the overall thickness of sandwich panel) and (2) the fiber volume fraction in the skin layer which has a direct impact on the coefficient of thermal expansion of the skin layer. The individual material properties including the properties of glass, fiber, and the matrix were extracted from the literature and are listed in Table 1.

TABLE 1

|  | Coefficient of Thermal Expansion ($10^{-6}/°$ C.) | Young Modulus (GPa) |
| --- | --- | --- |
| Polyurethane Rigid Foam | 30 | 1 |
| Carbon Fiber | −0.6 | 230 |
| Glass Fiber | 5 | 72.4 |
| Kevlar | −2 | 131 |
| Epoxy | 44 | 4.3 |

The overall thickness of the sandwich back panel was set at 10 millimeters (mm). The coefficient of thermal expansion of a conventional glass panel that was compared is 0.0000078/° C. Therefore, the coefficient of thermal expansion of the composite sandwich panel structure back panel was set to be equal to or less than the coefficient of thermal expansion of the glass panel.

The coefficient of thermal expansion of the skin layer only and the overall coefficient of thermal expansion of the composite sandwich panel structure or panel were calculated using the Schapery model in longitudinal and transverse directions as shown below:

$$\alpha_1 = \frac{E_{f1}\alpha_{f1}V_f + E_m\alpha_m V_m}{E_{f1}V_f + E_m V_m} \quad (1)$$

$$\alpha_2 = (1 + v_{f12})\alpha_{f2}V_f + (1 + v_m)\alpha_m V_m - \alpha_1(v_{f12}V_f + v_m V_m) \quad (2)$$

Where equation (1) was used for calculating the coefficient of thermal expansion in the longitudinal direction, and equation (2) was used for calculating the coefficient of thermal expansion in the transverse direction.

Where $\alpha_{f1}$ is the coefficient of thermal expansion of the fiber in the longitudinal direction, $\alpha_{f2}$ is the coefficient of thermal expansion of the fiber in the transverse direction, $v_{f12}$ is the Poisson ratio of the fiber. $A_m$ is the coefficient of thermal expansion of the matrix, $V_m$ is the volume fraction of the matrix, $V_f$ is the volume fraction of the fibers, $Ef_1$ is the modulus of elasticity of the fibers in the longitudinal direction, and $E_m$ is the modulus of elasticity of the matrix.

Example 1

A composite sandwich panel made with skin layers including carbon fiber/epoxy materials and a core layer made with polyurethane rigid foam was tested as a back panel for the solar panel, using the calculations described above. The coefficient of thermal expansion of glass was used as a reference. Table 2 shows the results.

TABLE 2

| PU rigid foam and CF/epoxy | | | | Volume fraction of skin layer | | | | |
|---|---|---|---|---|---|---|---|---|
| | 4.4 | 0.05 | 0.1 | 0.15 | 0.2 | 0.25 | 0.3 | 0.35 |
| Volume | 0 | 32.60 | 34.55 | 36.07 | 37.29 | 38.28 | 39.10 | 39.80 |
| fraction | 0.1 | 15.85 | 11.92 | 10.07 | 9.00 | 8.29 | 7.80 | 7.43 |
| of fiber | 0.2 | 10.15 | 6.76 | 5.35 | 4.58 | 4.10 | 3.77 | 3.52 |
| | 0.3 | 7.27 | 4.47 | 3.38 | 2.79 | 2.43 | 2.18 | 2.00 |
| | 0.4 | 5.54 | 3.18 | 2.29 | 1.82 | 1.53 | 1.33 | 1.19 |
| | 0.5 | 4.38 | 2.35 | 1.60 | 1.21 | 0.97 | 0.81 | 0.69 |
| | 0.6 | 3.55 | 1.77 | 1.13 | 0.79 | 0.59 | 0.45 | 0.35 |
| | 0.7 | 2.93 | 1.35 | 0.78 | 0.49 | 0.31 | 0.19 | 0.10 |
| | 0.8 | 2.44 | 1.02 | 0.51 | 0.25 | 0.09 | −0.01 | −0.09 |
| | 4.4 | 0.65 | 0.7 | 0.75 | 0.8 | 0.85 | 0.9 | 0.95 | 1 |
| Volume | 0 | 42.45 | 42.74 | 43.00 | 43.24 | 43.45 | 43.65 | 43.83 | 44 |
| fraction | 0.1 | 6.35 | 6.25 | 6.17 | 6.10 | 6.03 | 5.97 | 5.92 | 5.87 |
| of fiber | 0.2 | 2.83 | 2.77 | 2.71 | 2.67 | 2.63 | 2.59 | 2.56 | 2.53 |
| | 0.3 | 1.49 | 1.45 | 1.41 | 1.38 | 1.35 | 1.33 | 1.30 | 1.28 |
| | 0.4 | 0.79 | 0.76 | 0.73 | 0.71 | 0.68 | 0.66 | 0.64 | 0.63 |
| | 0.5 | 0.36 | 0.33 | 0.31 | 0.29 | 0.27 | 0.25 | 0.24 | 0.23 |
| | 0.6 | 0.07 | 0.05 | 0.03 | 0.01 | −0.01 | −0.02 | −0.03 | −0.05 |
| | 0.7 | −0.14 | −0.16 | −0.18 | −0.20 | −0.21 | −0.22 | −0.23 | −0.24 |
| | 0.8 | −0.30 | −0.32 | −0.34 | −0.35 | −0.36 | −0.37 | −0.38 | −0.39 |

In Table 2, the bolded values represent where the coefficient of thermal expansion for the composite sandwich panel was higher than the coefficient of thermal expansion of glass while the non-bolded values represent where the coefficient of thermal expansion for the composite sandwich panel was equal to or lower than the coefficient of thermal expansion of glass.

As shown in Table 2, a wide range of thicknesses of the skin may be effective for the coefficient of thermal expansion of the composite sandwich panel to be equal to or less than the coefficient of thermal expansion of glass, and therefore, have an acceptable performance of the composite sandwich panel in a photovoltaic module, as long as the volume fraction of the fiber in the skin is over 30%. For a non-limiting example, if the fiber content in the skin is 20%, the volume fraction of the skin layers (in combination) is at least 10%. For another non-limiting example, if the fiber content in the skin is 10%, the volume fraction of the skin layers (in combination) is at least 30%.

Example 2

A composite sandwich panel made with skin layers including glass fibers/epoxy materials and a core layer made with polyurethane rigid foam was tested as a back panel for a solar panel, using the calculations described above. The coefficient of thermal expansion of glass was used as a reference. Table 3 shows the results.

TABLE 3

| PU rigid foam and GF/epoxy | | | | Volume fraction of skin layer | | | | |
|---|---|---|---|---|---|---|---|---|
| | 15.0 | 0.05 | 0.1 | 0.15 | 0.2 | 0.25 | 0.3 | 0.35 |
| Volume | 0 | 32.60 | 34.55 | 36.07 | 37.29 | 38.28 | 39.10 | 39.80 |
| fraction | 0.1 | 25.91 | 23.87 | 22.66 | 21.85 | 21.28 | 20.84 | 20.51 |
| of fiber | 0.2 | 21.68 | 18.59 | 16.98 | 15.99 | 15.32 | 14.84 | 14.47 |
| | 0.3 | 18.76 | 15.43 | 13.84 | 12.90 | 12.28 | 11.85 | 11.52 |
| | 0.4 | 16.63 | 13.34 | 11.84 | 10.99 | 10.44 | 10.06 | 9.77 |
| | 0.5 | 15.01 | 11.84 | 10.47 | 9.70 | 9.21 | 8.87 | 8.62 |
| | 0.6 | 13.73 | 10.72 | 9.46 | 8.76 | 8.32 | 8.02 | 7.80 |
| | 0.7 | 12.69 | 9.85 | 8.69 | 8.06 | 7.66 | 7.38 | 7.18 |
| | 0.8 | 11.84 | 9.16 | 8.08 | 7.50 | 7.14 | 6.89 | 6.71 |
| | 15.0 | 0.65 | 0.7 | 0.75 | 0.8 | 0.85 | 0.9 | 0.95 | 1 |
| Volume | 0 | 42.45 | 42.74 | 43.00 | 43.24 | 43.45 | 43.65 | 43.83 | 44.00 |
| fraction | 0.1 | 19.44 | 19.34 | 19.25 | 19.17 | 19.10 | 19.04 | 18.98 | 18.93 |
| of fiber | 0.2 | 13.36 | 13.26 | 13.18 | 13.10 | 13.03 | 12.97 | 12.92 | 12.87 |
| | 0.3 | 10.56 | 10.47 | 10.40 | 10.34 | 10.28 | 10.23 | 10.18 | 10.14 |
| | 0.4 | 8.94 | 8.87 | 8.81 | 8.75 | 8.70 | 8.66 | 8.62 | 8.58 |
| | 0.5 | 7.89 | 7.83 | 7.78 | 7.73 | 7.69 | 7.65 | 7.61 | 7.58 |
| | 0.6 | 7.16 | 7.10 | 7.05 | 7.01 | 6.97 | 6.94 | 6.91 | 6.88 |
| | 0.7 | 6.61 | 6.56 | 6.52 | 6.48 | 6.45 | 6.42 | 6.39 | 6.37 |
| | 0.8 | 6.19 | 6.14 | 6.11 | 6.07 | 6.04 | 6.02 | 5.99 | 5.97 |

In Table 3, the bolded values represent where the coefficient of thermal expansion for the composite sandwich panel was higher than the coefficient of thermal expansion of glass while the non-bolded values represent where the coefficient of thermal expansion for the composite sandwich panel was equal to or lower than the coefficient of thermal expansion of glass.

As shown in Table 3, for the composite sandwich panel made with glass fibers/epoxy skin and polyurethane rigid foam core, the composite sandwich panel coefficient of thermal expansion is equal to or lower than the coefficient of thermal expansion of glass when the skin volume fraction is at a minimum of 20%, and the fiber volume fraction is at least 80%. For a non-limiting example, if the fiber content in the skin is 70%, the volume fraction of skin layers (in combination) is at least 25%. For another non-limiting example, if the fiber in the skin is 60%, the volume fraction of skin layers (in combination) is at least 35%. If the fiber in the skin is 50%, the volume fraction of skin layers (in combination) is at least 75%.

Example 3

A composite sandwich panel made with a skin layer comprising Kevlar/epoxy materials and a core layer made with polyurethane rigid foam was tested as a back panel for a solar panel, using the calculation described above. The coefficient of thermal expansion of glass was used as a reference. Table 4 shows the results.

TABLE 4

| PU rigid foam and Kevlar/ epoxy | Volume fraction of skin layer | | | | | | | |
|---|---|---|---|---|---|---|---|---|
| | 6.2 | 0.05 | 0.1 | 0.15 | 0.2 | 0.25 | 0.3 | 0.35 |
| Volume fraction of fiber | 0 | 32.60 | 34.55 | 36.07 | 37.29 | 38.28 | 39.10 | 39.80 |
| | 0.1 | 19.88 | 15.98 | 13.92 | 12.65 | 11.78 | 11.15 | 10.68 |
| | 0.2 | 13.77 | 9.58 | 7.65 | 6.54 | 5.83 | 5.32 | 4.95 |
| | 0.3 | 10.19 | 6.33 | 4.69 | 3.78 | 3.20 | 2.80 | 2.51 |
| | 0.4 | 7.83 | 4.37 | 2.96 | 2.20 | 1.72 | 1.39 | 1.15 |
| | 0.5 | 6.17 | 3.06 | 1.83 | 1.18 | 0.77 | 0.49 | 0.29 |
| | 0.6 | 4.92 | 2.12 | 1.04 | 0.46 | 0.11 | −0.13 | −0.31 |
| | 0.7 | 3.96 | 1.41 | 0.44 | −0.06 | −0.38 | −0.59 | −0.74 |
| | 0.8 | 3.20 | 0.86 | −0.01 | −0.47 | −0.75 | −0.94 | −1.08 |
| | 6.2 | 0.65 | 0.7 | 0.75 | 0.8 | 0.85 | 0.9 | 0.95 | 1 |
| Volume fraction of fiber | 0 | 42.45 | 42.74 | 43.00 | 43.24 | 43.45 | 43.65 | 43.83 | 44.00 |
| | 0.1 | 9.22 | 9.09 | 8.98 | 8.88 | 8.79 | 8.70 | 8.63 | 8.57 |
| | 0.2 | 3.86 | 3.76 | 3.68 | 3.60 | 3.54 | 3.48 | 3.43 | 3.38 |
| | 0.3 | 1.66 | 1.59 | 1.52 | 1.47 | 1.42 | 1.38 | 1.34 | 1.30 |
| | 0.4 | 0.47 | 0.41 | 0.36 | 0.31 | 0.27 | 0.24 | 0.21 | 0.18 |
| | 0.5 | −0.28 | −0.33 | −0.38 | −0.41 | −0.45 | −0.47 | −0.50 | −0.52 |
| | 0.6 | −0.80 | −0.84 | −0.88 | −0.91 | −0.94 | −0.96 | −0.99 | −1.01 |
| | 0.7 | −1.18 | −1.21 | −1.24 | −1.27 | −1.30 | −1.32 | −1.34 | −1.36 |
| | 0.8 | −1.46 | −1.49 | −1.52 | −1.55 | −1.57 | −1.59 | −1.61 | −1.62 |

In Table 4, the bolded values represent where the coefficient of thermal expansion for the composite sandwich panel was higher than the coefficient of thermal expansion of glass while the non-bolded values represent where the coefficient of thermal expansion for the composite sandwich panel was lower than the coefficient of thermal expansion of glass.

As shown in Table 4, for the composite sandwich panel made with Kevlar/epoxy skin and polyurethane rigid foam core, any skin thickness would work for the coefficient of thermal expansion of the sandwich panel to be equal to or less than the coefficient of thermal expansion of glass as long as the fiber volume fraction in the skin layer is higher than 50%.

For a non-limiting example, if the fiber content in the skin is 30%, the volume fraction of the skin layers (in combination) is at least 10%. For another non-limiting example, if the fiber content in the skin is 20%, the volume fraction of the skin layers (in combination) is at least 15%.

Example 4

This example is a prophetic example. This example illustrates the testing of a photovoltaic module such as shown in FIG. 3 incorporating the layering of a composite panel layered with ribbons and solar cells as shown in FIGS. 2A and 2B and designed as described herein, such as described in Examples 1-3.

Referring to FIGS. 2A and 2B, if the thermal expansion of a component of a panel and the back sheet, front sheet, and encapsulant are mismatched or are not in a similar range, ribbons 212 can be exposed to drastic expansion and contraction and may eventually fail. Testing is used to determine that failure does not occur until after a certain period of time. For example, the composite panel passes a period of time of testing if it does not fail until after that period of time.

Figure 4A:
FIG. 4A is a schematic showing an exemplary thermal expansion of a ribbon as occurring in prophetic fatigue testing in accordance with one or more embodiments.
Figure 4B:
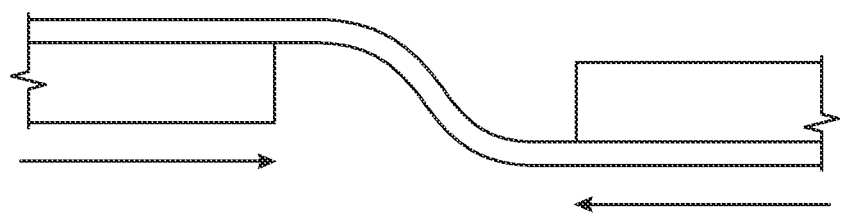
FIG. 4B is a schematic showing an exemplary thermal contraction of a ribbon as occurring in prophetic fatigue testing in accordance with one or more embodiments.
Figure 4C:
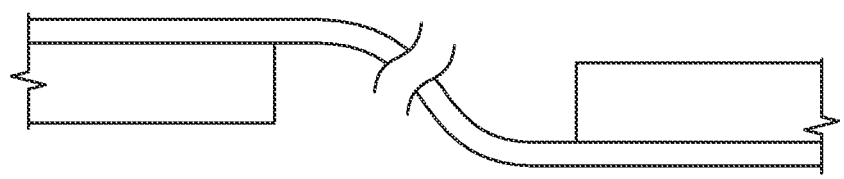
FIG. 4C is a schematic showing an exemplary failure of a ribbon due to thermal fatigue as occurring in prophetic fatigue testing in accordance with one or more embodiments.

As shown, FIG. 4A illustrates the thermal expansion of the interconnection cell ribbon, FIG. 4B illustrates the thermal contraction of the interconnection cell ribbon and FIG. 4C illustrates a failure of an interconnection cell ribbon due to thermal fatigue in accordance with the embodiments. As shown in FIGS. 4A, 4B, and 4C, the temperature fluctuation causes repeated expansion and contraction which induce thermal stresses or thermal fatigue on ribbons, cells, and solder materials due to the large thermal expansion differences among these parts of a layered component and the front/back sheets.

Figure 5B:
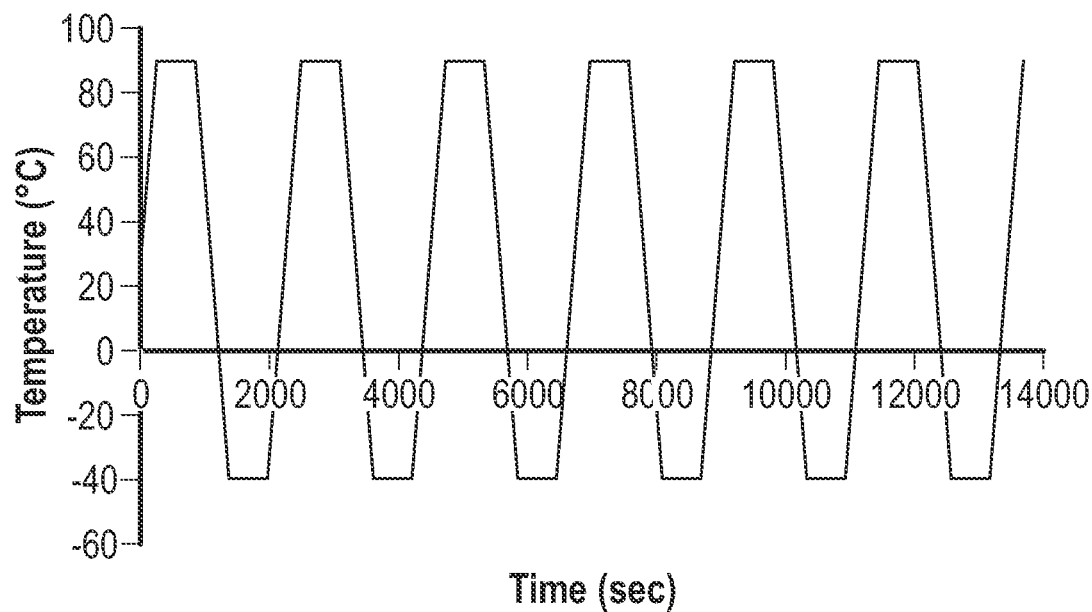
FIG. 5B is a graphical representation of an exemplary thermocycling test profile over a temperature range from −40° C. to 85° C. of repeated cycling as occurring in prophetic fatigue testing in accordance with one or more embodiments.

As shown, FIG. 5A illustrates a thermocycling test profile over a temperature range from −40° C. to 85° C. of repeated cycling in accordance with the embodiments. FIG. 5B shows a graphical representation of FIG. 5A, therefore, represents the thermocycling test profile over a temperature range from −40° C. to 85° C. of repeated cycling. Referring to FIG. 5A, starting from ambient conditions, the temperature is ramped down to −40° C. at 100 C/h rate and held at −40° C. for 10 minutes dwell time and then ramped up to 85° C. at 100° C./h rate and held at 85° C. for 10 minutes dwell time. This is considered as one cycle which is repeated.

A photovoltaic module such as shown in FIG. 3 incorporating the layering of a composite panel layered with ribbons and solar cells as shown in FIGS. 2A and 2B and designed as described herein, such as described in Examples 1-3, will pass 1000 hours of thermal testing following the profile shown in FIGS. 5A and 5B.

Example 5

This example is a prophetic example.

Figure 6:
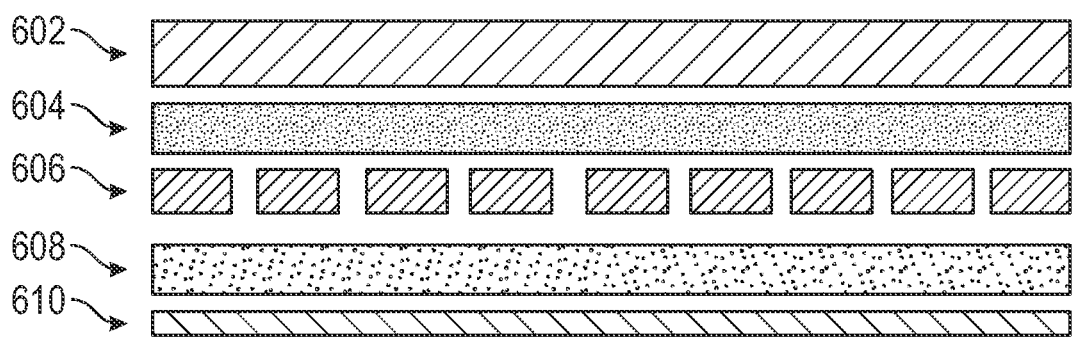
FIG. 6 is a schematic showing a comparative photovoltaic structure for reference in prophetic testing of a photovoltaic module as shown in FIG. 3 in accordance with one or more embodiments.

As shown in FIG. 6, a comparative conventional glass photovoltaic module in accordance with the embodiments includes a front layer 602 on top, a first EVA 604 below the front layer 602, a Si Cell 606 below the first EVA 604, a second EVA 608, and a flexible back sheet 610 below the second EVA 608. Table 5 lists the properties of these materials. Front layer 602 is glass. The flexible back sheet 610 is a commercially available Tedlar film.

TABLE 5

| Materials | Thickness (mm) | Thermal expansion (10^(−6)/C.) | Modulus (Gpa) | Volume fraction | Thermal expansion contribution | Thermal expansion contribution |
|---|---|---|---|---|---|---|
| Glass | 4 | 7.8 | 80 | 0.70 | 437.9 | 93% |
| EVA | 0.5 | 70 | 1 | 0.09 | 6.1 | 1% |
| Cell | 0.2 | 2.25 | 180 | 0.04 | 14.2 | 3% |
| EVA | 0.5 | 70 | 1 | 0.09 | 6.1 | 1% |
| Back sheet | 0.5 | 50 | 2 | 0.09 | 8.8 | 2% |

As shown in Table 5, the thermal expansion of the comparative conventional glass photovoltaic module mostly depends on the coefficient of thermal expansion of the glass layer out of all other layers. Thus, comparative conventional glass photovoltaic module where glass is used as the main support, or back panel, the thermal expansion of the glass panel dominates the overall thermal expansion of the photovoltaic module due to the high-volume fraction of the glass to the overall photovoltaic module. As shown in Table 5, glass contributes by 93% to the thermal expansion of comparative conventional glass photovoltaic module.

The photovoltaic module of FIG. 3 has fewer required properties for back panel 314 as compared to front layer 602 in the comparative photovoltaic module of FIG. 6 in order to achieve desirable performance. Conventional required properties of front layer 602 as a front sheet are high VLT, UV resistance, barrier properties, Low CTE, excellent adhesion to EVA, and rigidity. In comparison, back panel 314 does not require high VLT, UV resistance, or abrasion resistance.

A composite sandwich panel as provided in Examples 1-3 as a back panel when incorporated into a photovoltaic module as shown in FIG. 3 will ensure that the thermal expansion of the composite sandwich panel structure matches the thermal expansion of glass. Thus, a composite sandwich panel as shown in FIG. 1B in the photovoltaic module as shown in FIG. 3 will meets similar or improved performance to glass in the comparative conventional glass photovoltaic module as shown in FIG. 6.

Embodiments of the present disclosure may provide at least one of the following advantages. The composite sandwich panel structure may be used in the photovoltaic industry for instance as one application in addition to cable trays. In conventional photovoltaic industry panels, glass is the predominant material as a front sheet for its high light transmission, ultra-violet ray and barrier resistance, and structural integrity. However, there are challenges associated with conventional glass panels, including impact resistance, heavyweight of glass during manufacturing, transportation, and installation, and some roof structures have difficulties with withstanding loads of glass panels. Therefore, to overcome the limitations of the conventional photovoltaic panels, improved, non-metallic photovoltaic panels are needed. There have been efforts to develop a full plastic photovoltaic module, but they encounter many techno-economic challenges. The disclosed composite sandwich panel structure as a photovoltaic panel may encounter some challenges that the convention photovoltaic panels face. One of them may include thermal fatigue of solar cells, and ribbons induced during thermal cycling. The photovoltaic modules are subjected to a large temperature gradient from day to night and vice versa and temperature swings are stimulated in lab thermocycling testing that the whole module needs to pass. The module needs to pass 1000 hours of testing while maintaining certain energy threshold output. The disclosed composite sandwich panel structure passes the tests while maintaining structural integrity.

"Optionally" means that the subsequently described event or circumstances may or may not occur. The description includes instances where the event or circumstance occurs and instances where it does not occur.

When the word "approximately" or "about" is used, this term may mean that there can be a variance in the value of up to ±10%, of up to 5%, of up to 2%, of up to 1%, of up to 0.5%, of up to 0.1%, or up to 0.01%.

"Includes" and its variations such as including mean includes but is not limited to, and its respective variations such as including but not limited to.

Ranges may be expressed as from about one particular value to about another particular value, inclusive. When such a range is expressed, it should be understood that another one or more embodiments are from the one particular value to the other particular value, along with all particular values and combinations thereof within the range.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

While one or more embodiments of the present disclosure have been described with respect to a limited number of embodiments, those skilled in the art, having benefit of this disclosure, will appreciate that other embodiments can be devised, which do not depart from the scope of the disclosure. Accordingly, the scope of the disclosure should be limited only by the attached claims.

What is claimed:

1. A photovoltaic module, comprising:
   a plurality of ribbons; and
   a composite panel comprising:
     a core layer comprising a core material;
     a skin layer supported by a surface of the core layer and formed of a matrix material and a plurality of parallel fibers aligned with the plurality of ribbons in the same longitudinal direction and disposed in the matrix material;
     wherein a volume fraction of the plurality of parallel fibers in the composite panel ranges from about 10% to about 80%; and
     wherein coefficient of thermal expansion of the composite panel ranges from about $4\times10^{-6}/°$ C. to about $100\times10^{-6}/°$ C.

2. The photovoltaic module of claim 1, wherein the composite panel further comprises another skin layer supported by an opposing surface of the core layer.

3. The photovoltaic module of claim 1, wherein the core material is different from the matrix material.

4. The photovoltaic module of claim 1, wherein the core material is same as the matrix material and optionally comprises another plurality of parallel fibers aligned in common with the first plurality of fibers and disposed in the core material.

5. The photovoltaic module of claim 1, wherein the plurality of parallel fibers are selected from the group consisting of glass fibers, carbon fibers, basalt fibers, aramid fibers, boron fibers, and combinations thereof.

6. The photovoltaic module of claim 1, wherein a volume fraction of the skin layer in the composite panel ranges from about 5% to less than 100%.

7. The photovoltaic module of claim 1, wherein coefficient of thermal expansion of the core layer ranges from about $4 \times 10^{-6}/°$ C. to about $100 \times 10^{-6}/°$ C.

8. The photovoltaic module of claim 1, wherein a thickness of the composite panel ranges from about 1 mm to about 100 mm.

9. The photovoltaic module of claim 1, wherein the core material is selected from the group consisting of rigid foam, polyurethane, honeycomb, solid plastic, and combinations thereof.

10. The photovoltaic module of claim 1, wherein the matrix material of the skin layer is selected from the group consisting of poly(methyl methacrylate) (PMMA), ethylene tetrafluoroethylene (ETFE), ethylene chlorotrifluoroethylene (E-CTFE), cyclic olefin copolymer (COC), epoxy, polycarbonate, and combinations thereof.

11. The photovoltaic module of claim 1, wherein the skin layer comprises unidirectional tape.

12. The photovoltaic module of claim 1, wherein the composite panel has a coefficient of thermal expansion equal to or lesser than a coefficient of thermal expansion of a component layered with the composite panel and comprising the plurality of ribbons.

13. The composite panel of claim 12, wherein the component comprises a circuit, a wire, a solar cell, or combinations thereof.

14. The photovoltaic module of claim 12, wherein the component is layered between a thin transparent front sheet and the composite panel, wherein the composite panel is a back panel.

15. The photovoltaic module of claim 14, wherein the thin transparent front sheet comprises a material selected from the group consisting of poly(methyl methacrylate) (PMMA), ethylene tetrafluoroethylene (ETFE), ethylene chlorotrifluoroethylene (E-CTFE), cyclic olefin copolymer (COC), epoxy, polycarbonate, and combinations thereof.

16. The photovoltaic module of claim 1, wherein the plurality of parallel fibers are embedded in the matrix material.

17. A method of making a photovoltaic module, the method comprising:
   applying a pair of skin layers to a core layer, each skin layer comprising a skin material and a plurality of parallel fibers disposed in the skin material to make a composite sandwich panel; and
   layering a component comprising ribbons between the composite sandwich panel and a thin, transparent front sheet;
   wherein the plurality of parallel fibers are aligned with the ribbons;
   wherein a volume fraction of the plurality of parallel fibers in the composite sandwich panel ranges from about 10% to about 80%;
   wherein the composite sandwich panel has a coefficient of thermal expansion equal to or lesser than a coefficient of thermal expansion of the component; and
   wherein coefficient of thermal expansion of the composite panel ranges from about $4 \times 10^{-6}/°$ C. to about $100 \times 10^{-6}/°$ C.

* * * * *